(12) United States Patent
Varnica et al.

(10) Patent No.: US 8,312,354 B1
(45) Date of Patent: Nov. 13, 2012

(54) METHOD AND APPARATUS FOR IMPROVED PERFORMANCE OF ITERATIVE DECODERS ON CHANNELS WITH MEMORY

(75) Inventors: Nedeljko Varnica, Sunnyvale, CA (US); Nitin Nangare, Santa Clara, CA (US); Gregory Burd, San Jose, CA (US); Zining Wu, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 991 days.

(21) Appl. No.: 12/336,280

(22) Filed: Dec. 16, 2008

Related U.S. Application Data

(60) Provisional application No. 61/017,055, filed on Dec. 27, 2007.

(51) Int. Cl.
  *H03M 13/45* (2006.01)
(52) U.S. Cl. .......................................................... 714/780

(58) Field of Classification Search .................. 714/758, 714/780
See application file for complete search history.

(56) References Cited

U.S. PATENT DOCUMENTS 7,237,181 B2 * 6/2007 Richardson ................... 714/780

* cited by examiner

*Primary Examiner* — Amine Riad

(57) ABSTRACT

Systems and methods for improving the performance of iterative decoders on various channels with memory are disclosed. These systems and methods may reduce the frequency or number of situations in which the iterative decoder cannot produce decoded data that matches the data that was originally sent in a communications or data storage system. The iterative decoder includes a SISO channel detector and an ECC decoder and decodes the coded information according to at least one iterative decoding algorithm in regular decoding mode and/or at least one iterative decoding algorithm in error-recovery mode.

8 Claims, 8 Drawing Sheets

METHOD AND APPARATUS FOR IMPROVED PERFORMANCE OF ITERATIVE DECODERS ON CHANNELS WITH MEMORY

BACKGROUND OF THE INVENTION

This claims the benefit under 35 U.S.C. §119(e) of U.S. Provisional Application No. 61/017,055, filed Dec. 27, 2007, which is hereby incorporated by reference herein in its entirety.

BACKGROUND OF THE DISCLOSURE

The disclosed technology relates generally to data decoding, and more particularly to iterative decoders for data encoded with a low-density parity check (LDPC) encoder.

With the continuing demand for high-reliability transmission of information in digital communication and storage systems, and with the rapid increase in available computational power, various coding and decoding techniques have been investigated and applied to increase the performance of these systems.

Low-density parity check (LDPC) codes are among the few known error control coding techniques capable of transmitting information at a rate close to the Shannon limit or channel-capacity. Currently, LDPC codes are considered to be the next-generation communication system encoding standard. LDPC coding techniques are generally iterative in nature, and can be represented by many different types of parity check matrices. The structure of an LDPC code's parity check matrix can be, for example, random, cyclic, or quasi-cyclic. LDPC codes defined by quasi-cyclic parity check matrices are particularly common and computationally efficient. These codes are known as quasi-cyclic low density parity check (QC-LDPC) codes.

One decoding technique for LDPC codes in channels with memory, iterative decoding, may be carried out via an iterative message passage algorithm. An iterative decoder may consist of two components—a soft-input soft-output (SISO) channel detector, and an error correction code (ECC) decoder. In performing iterative decoding, an iterative decoder may alternate between use of a SISO channel detector and ECC decoder. The information from an iteration of the SISO channel detector may be passed to the ECC decoder for use in the next ECC decoding iteration, and vice versa. Through this iterative process, data reliability is improved.

The performance capability of a coding scheme, such as a LDPC coding scheme, is often described by the code's performance curve, which is a plot of signal-to-noise ratios (SNR) vs. it Error Rate (BER) or Sector Error Rate (SER). The performance curve of LDPC codes generally consists of two regions: a waterfall region and an error floor region (see FIG. 4). In the waterfall region, the code's BER or equivalently, SER, decreases rapidly with improvements in SNR. However, in the high SNR operating region, the BER/SER disadvantageously plateaus to an error floor, meaning that further improvements in channel condition would not lead to significantly lower BER/SER. Although the error floors of well designed LDPC codes are generally low, the error floors might not be acceptable for communication channels that must guarantee a high degree of data reliability.

SUMMARY OF THE DISCLOSURE

Accordingly, systems and methods for improving the performance of iterative decoders on various channels are disclosed. These systems and methods may improve performance by reducing the frequency or number of situations in which the iterative decoder fails to converge to a valid codeword—i.e., the situations in which the iterative decoder cannot produce decoded data that matches the original sent data in a communications or data storage system.

The disclosed embodiments can be employed in any suitable iterative decoder. The iterative decoder may include a SISO channel detector and an error correcting code decoder. The SISO channel detector may decode data using a soft output Viterbi algorithm (SOVA), a Bahle, Cocke, Jelinek, and Reviv (BCJR) algorithm, or any other suitable soft-input soft-output algorithm. The ECC decoder may be configured to decode data using a LDPC decoder or a quasi-cyclic LDPC decoder or any other LDPC decoder.

In decoding, the iterative decoder may receive data and decode the received data according to a first decoding mode. In the first decoding mode, a number of channel iterations may be performed. One channel iteration includes an iteration of the SISO channel detector and at least one iteration of the ECC decoder. However, the first decoding mode may fail to produce a decoded codeword.

In an embodiment, if the first decoding mode fails to produce a decoded codeword, then the iterative decoding algorithm may decode the received data using a second decoding mode. The second iterative decoding mode may perform more channel iterations than the first iterative decoding mode. Further, the second iterative decoding mode may perform multiple decoding rounds, where each successive round of decoding may contain more channel iterations than the previous round. The ECC decoder may be reinitialized after each channel iteration. This reinitialization combined with an increased number of channel iterations may allow the iterative decoder to produce few errors when the channel over which the received data is sent has a high SNR.

In an embodiment, the second decoding mode may perform multiple decoding rounds. The first decoding round of the second decoding mode may contain fewer inner iterations in the ECC decoder than the first decoding mode. In addition, each successive decoding round may contain more channel iterations than the previous round, more inner iterations in the ECC decoder than the previous round, or both. Varying the number of channel iterations and inner iterations in the ECC decoder in this fashion may allow the iterative decoder to produce few errors when the channel over which the received data is sent has a medium or high SNR.

In an embodiment, the second decoding mode may perform multiple decoding rounds. The first decoding round of the second decoding mode may contain more inner iterations in the ECC decoder than the first decoding mode. In addition, each successive round of decoding may contain more channel iterations than the previous round, fewer inner iterations in the ECC decoder than the previous round, or both. Varying the number of channel iterations and inner iterations in the ECC decoder in this fashion may allow the iterative decoder to produce few errors when the channel over which the received data is sent has a high SNR.

During the second decoding mode, a set of decoded codewords may be produced. A decoded codeword may be selected according to a variety of metrics, and then output from the ECC decoder.

BRIEF DESCRIPTION OF THE FIGURES

The above and other aspects and advantages of the invention will be apparent upon consideration of the following detailed description, taken in conjunction with the accompanying drawings, in which like reference characters refer to like parts throughout, and in which.

DETAILED DESCRIPTION

The disclosed technology is directed toward systems and methods for LDPC decoding that lead to advantageously lowered error floors. In applications or devices where information may be altered by interference signals or other phenomena, error-correction codes, such as LDPC codes, can provide a measured way to protect information against such interference. As used herein, "information" and "data" refer to any unit or aggregate of energy or signals that contain some meaning or usefulness. Encoding may generally refer to the process of generating data in a manner that facilitates subsequent detection and/or correction of errors in the data, while decoding may generally refer to the counterpart process of detecting and/or correcting the errors. The elements of a coding system that perform encoding and decoding are likewise referred to as encoders and decoders, respectively.

Figure 1:
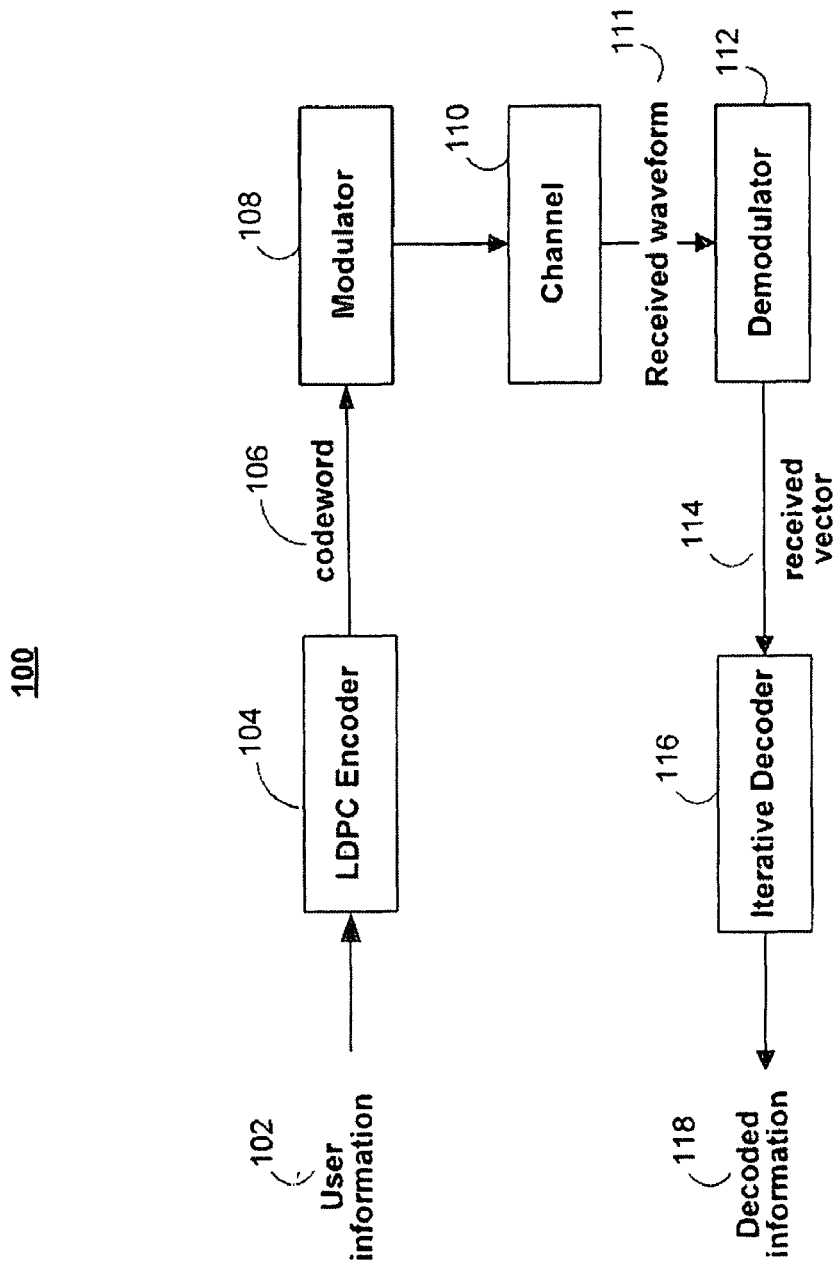
FIG. 1 shows an illustrative block diagram of an error-correcting communication/storage system in accordance with one aspect of the invention.

FIG. 1 shows an illustrative communication or data storage system 100 that utilizes error-correction codes for achieving reliable communication or storage. User information 102 is encoded through encoder 104. User information 102, often referred to as the message information or a message vector, may be grouped into units of k symbols, where each symbol may be binary, ternary, quaternary, or any other suitable type of data. However, for simplicity, embodiments of the present invention will be described in terms of binary bits. In the process of encoding user information 102, different codes can be used by encoder 104 to achieve different results.

As shown in FIG. 1, encoder 104 may encode user information 102 using a low density parity check (LDPC) code. The result of encoding user information 102 is codeword 106, also denoted as c. Codeword 106 may be of a predetermined length, which may be referred to as n.

In one implementation, codeword 106 is passed to a modulator 108. Modulator 108 prepares codeword 106 for transmission on channel 110. Modulator 108 may use phase-shift keying, frequency-shift keying, quadrature amplitude modulation, or any suitable modulation technique to modulate codeword 106 into one or more information-carrying signals. Channel 110 may be an asymmetric or symmetric channel. Channel 110 may represent media through which the information-carrying signals travel. For example, channel 110 may represent a wired or wireless medium in a communication system, or an electrical (e.g., RAM, ROM), magnetic (e.g., a hard disk), or optical (e.g., CD or DVD) storage medium in which the information-carrying signals can be stored.

Due to interference signals and other types of noise and phenomena, channel 110 may corrupt the waveform transmitted by modulator 108. Thus, the waveform received by demodulator 112, received waveform 111, may be different from the originally transmitted signal waveform. Received waveform 111 may be demodulated with demodulator 112. Demodulator 112 can demodulate received waveform 111 with filters, multiplication by periodic functions, or any suitable demodulation technique corresponding to the type of modulation used in modulator 108. The result of demodulation is received vector 114, which may contain errors due to channel corruption.

Received vector 114 may then be processed by decoder 116. Decoder 116 can be used to correct or detect errors in received vector 114. Decoder 116 may have two stages, where one stage employs a regular mode of operation and another stage employs an error recovery mode of operation. The iterative message-passing decoding algorithm may use, for example, a SISO channel detector and ECC code decoder. When utilizing such an iterative algorithm, decoder 116 may perform several iterations of the algorithm until the output of decoder 116 converges to a valid codeword. In some scenarios, the output of decoder 116 may fail to converge to a valid codeword. Decoder failure may occur for a variety of reasons, which will be discussed further below. Because the output of decoder 116 may never converge to a valid codeword in certain situations, decoder 116 may be equipped with a maximum iteration limit, which can be any suitable predetermined number. When decoder 116 reaches the maximum iteration limit, decoder 116 may automatically terminate operation and move on to the next received vector 114. However, if the output of decoder 116 successfully converges to a valid codeword, decoder 116 may then output decoded information 118.

Figure 2:
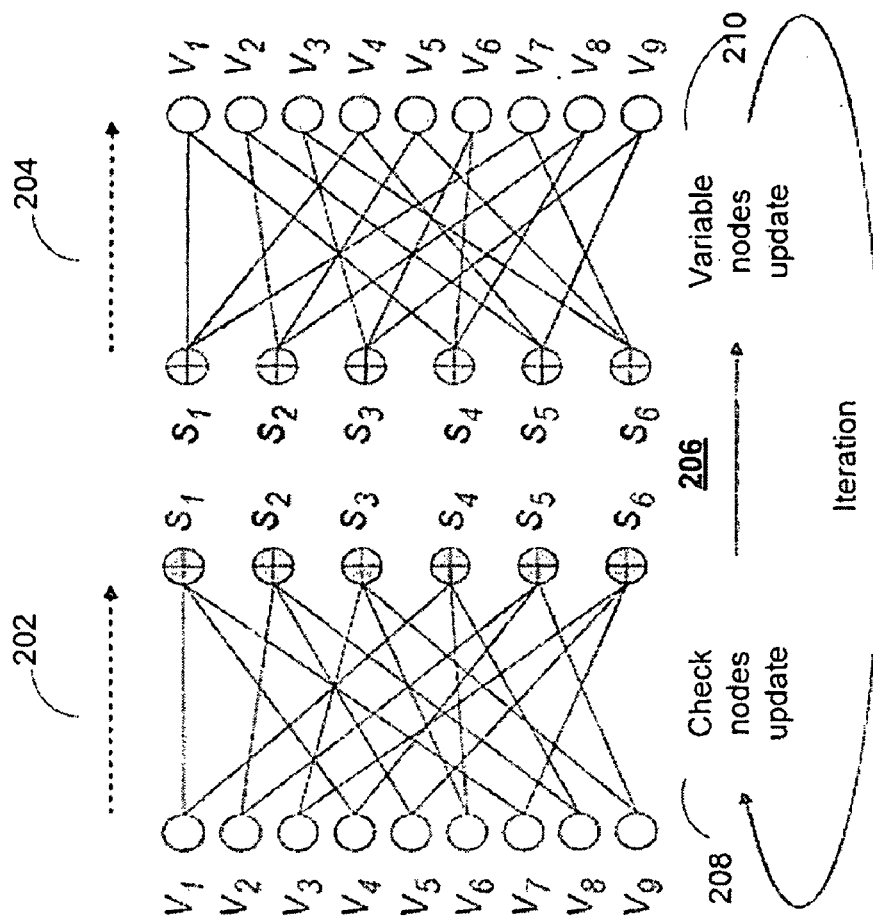
FIG. 2 shows a graphical illustration of a parity check matrix and iterative message passage algorithm corresponding to the parity check matrix.

The LDPC codes embodied by encoder 104 and decoder 116 are conventionally represented by mathematical vector models. In particular, an LDPC code can be described by a corresponding parity check matrix H. FIG. 2 shows a graphical illustration of a parity check matrix 201 and iterative message passage algorithm 206 corresponding to the parity check matrix 201. Parity check matrix 201 may have dimensions r×n, corresponding to codewords of length n and syndromes of length r. Codewords may be, for example, n-length codeword 106 of FIG. 1. Syndrome length r may satisfy the inequality $r \geq n-k$ and where k is the length of the information being encoded (e.g., length of user information 102 of FIG. 1).

Parity check matrix 201 may be constructed in manner that is efficient for digital storage. For example, parity check matrix 201 may contain a pattern or patterns that allow parity check matrix 201 to be represented with a small number of bits compared to the number of elements in parity check matrix 201.

An LDPC code may also be graphically represented as a Tanner graph, a bipartite graph showing the relationship between a LDPC code's codeword bits and syndrome bits. The advantages of using a Tanner graph of a LDPC code include access to efficient graph-based message-passing algorithms for decoding. Tanner graphs 202 and 204 correspond to parity check matrix 201. The check nodes and variable nodes of Tanner graphs 202 and 204 correspond to the rows and columns of parity check matrix 201. The undirected edges connecting check nodes with bit nodes correspond to the locations of the non-zero entries of parity check matrix 201. In other words, parity check matrix 201 is the adjacency matrix of Tanner graphs 202 and 204. For example, the 1 at the (1,1) location of parity check matrix 201 indicates that there is an edge between check node $s_1$ and variable node $v_1$. The 0 at the (1,2) location indicates that there is no edge between check node $s_1$ and variable node $v_2$.

The check nodes of a Tanner graph can either be satisfied or unsatisfied, where a satisfied node has a binary value of 0 and an unsatisfied node has a binary value of 1. A check node is satisfied (i.e., equal to 0), if the values of the bit nodes connected to the check node sum to an even number. In other words, the value of each check node is equal to the sum modulo two of the value of the bit nodes to which the check node is connected. For example, check node $s_2$ of Tanner graphs 202 and 204 would be satisfied if the values of variable nodes $v_2$, $v_5$, and $v_8$ add up to 0 (assuming binary addition). Furthermore, when a check node is unsatisfied, at least one of the bit nodes connected to the check node is in error. Thus, the value of the check nodes (or equivalent, the value of the syndrome produced by parity check matrix 202) provide a parity check on each codeword received by a LDPC decoder (e.g., decoder 116 of FIG. 1), thereby providing error correction capability to communication/storage system 100 of FIG. 1.

Tanner graphs 202 and 204 may be used to illustrate message passing algorithm 206. Iterative message passing algorithm 206 begins with the reception of an encoded codeword, such as n-length received vector 114 of FIG. 1. The received vector may be encoded by a particular LDPC code. Message passing algorithm 206 may then perform several iterations of message updates in accordance with the structure of Tanner graphs 202 and 204. At the end of each iteration, the number of unsatisfied check nodes present in a processed version of the received vector may be evaluated. This evaluation may include computing a syndrome corresponding to the processed version of the received vector.

Each iteration in message passing algorithm 206 may consist of two steps in which messages are passed between the check nodes and variable nodes, and vice versa. The messages may be in the form of log-likelihood ratios or another soft-information metric. For example, at step 208, each of the variable nodes in Tanner graphs 202 may send a message to each check node to which the variable node is connected. The check nodes may then perform an update by carrying out computations based on the messages that the check nodes received and a set of update rules. At step 210, each of the check nodes may send a current message to each variable node to which the check node is connected. The variable nodes may then perform an update by carrying out computations based on the messages the variable nodes receive and a set of update rules. This iterative process may be repeated until either the codeword has been decoded or until a threshold number of iterations has been reached.

Figure 3:
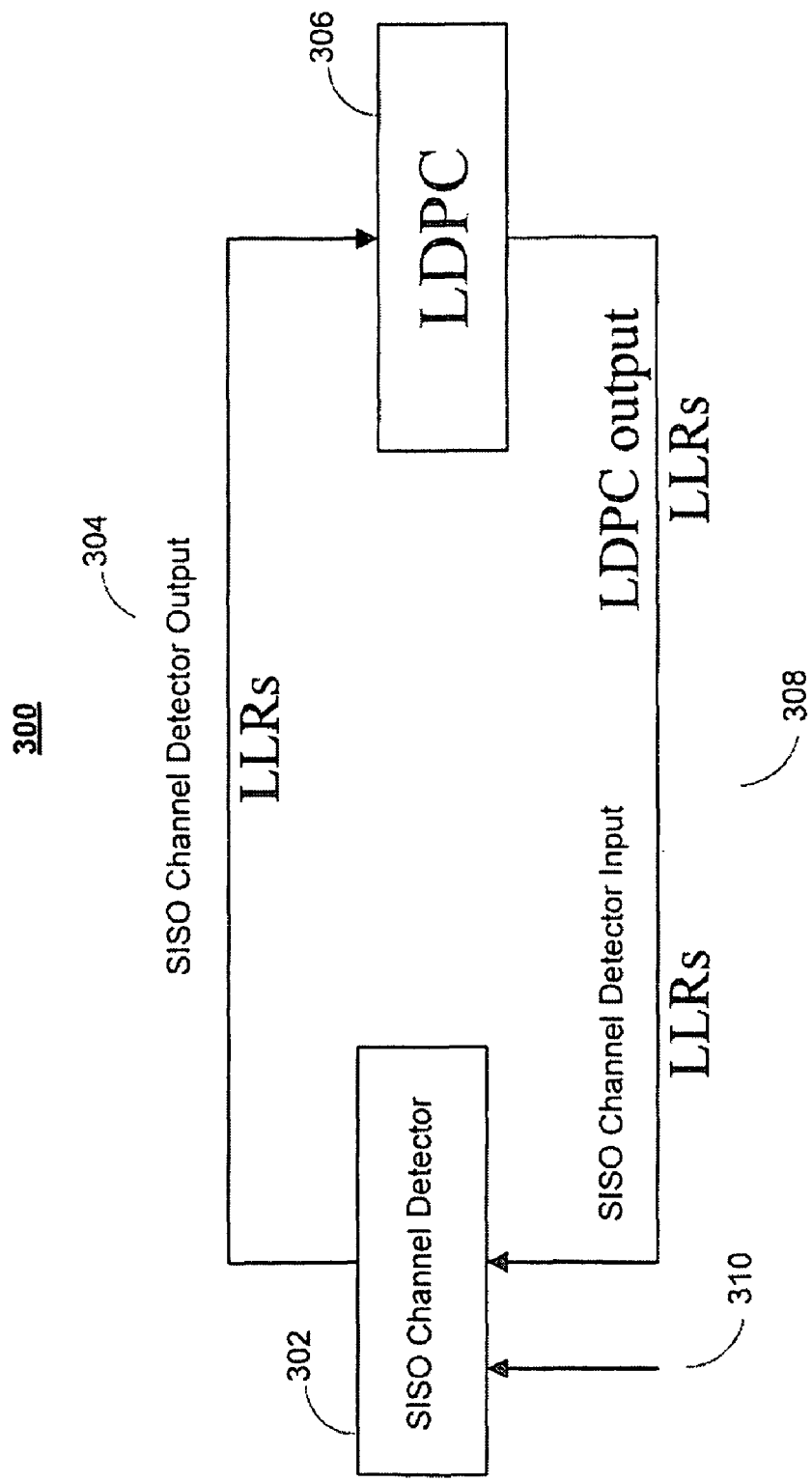
FIG. 3 shows a simplified block diagram of an iterative decoder.

FIG. 3 shows a simplified block diagram of an iterative decoder 300. Iterative decoder 300 may be included as part of a communication or data storage system—for example, iterative decoder 300 may be decoder 116 in communication or data storage system 100 of FIG. 1. Iterative decoder 300 may consist of two components—a soft-input soft-output (SISO) channel detector 302 and low-density parity check (LDPC) decoder 306. In an embodiment, LDPC decoder 306 may be a more generalized error correcting code (ECC) decoder that can handle a variety of iterative decoding algorithms. In performing iterative decoding, iterative decoder 300 may alternate between the user of SISO channel detector 302 and LDPC decoder 306. The information from an iteration of SISO channel detector 302 may be passed to the LDPC decoder 306 for use in the next LDPC decoding iteration, and vice versa. Through this iterative process, data reliability may be improved.

In each channel iteration in iterative decoder 300, received vector 310 may be passed as input to SISO channel detector 302. SISO channel detector 302 may then use a decoding algorithm to produce SISO channel detector Log Likelihood Ratios (LLRs) 304. These decoding algorithms may include a Soft-Output Viterbi Algorithm (SOVA), a Bahle, Cocke, Jelinek, and Reviv (BCJR) algorithm, or any other suitable decoding algorithm that produces soft information. SISO channel detector LLRs 304 may then be passed as input to LDPC decoder 306. LDPC decoder 306 may use the SISO channel detector LLRs to compute LDPC output LLRs 308. The LDPC output LLRs 308 may also be known as SISO channel detector input LLRs. LDPC output LLRs may then be passed as input to SISO channel detector 302.

In an embodiment, iterative decoder 300 may run multiple iterations in LDPC decoder 306 within a single iteration of channel (SISO) decoding. These LDPC decoder iterations are also referred to as inner iterations. Accordingly, LDPC decoder 306 may run several inner iterations after each update of LLRs from SISO detector 302 during the operation of iterative decoder 300. The process of running SISO channel detector 302 followed by running LDPC decoder 306 for at least one LDPC (inner) iteration may be referred to as a channel (outer) iteration. After an update by a SISO channel detector 302, or after any inner (LDPC) iteration in LDPC decoder 306, LDPC decoder 306 may be reinitialized by setting certain intrinsic LLR information in LDPC decoder 306 to zero. For example, assuming LDPC decoder 306 utilizes an iterative message passing algorithm such as message passing algorithm 206 illustrated in FIG. 2, the check-to-bit messages within LDPC decoder 306 may be set to zero after each channel iteration. Reinitializing LDPC decoder 306 may provide the benefit of allowing iterative decoder 300 to gain a higher level of accuracy in decoding when faced with particular types of errors, as described below.

At any point during decoding, LDPC output LLRs 308 may be used to produce decoded data. This decoded data may include bits that form a codeword of a particular LDPC code. The decoded data may be produced using a belief propagation algorithm, or any other suitable algorithm.

Figure 4:
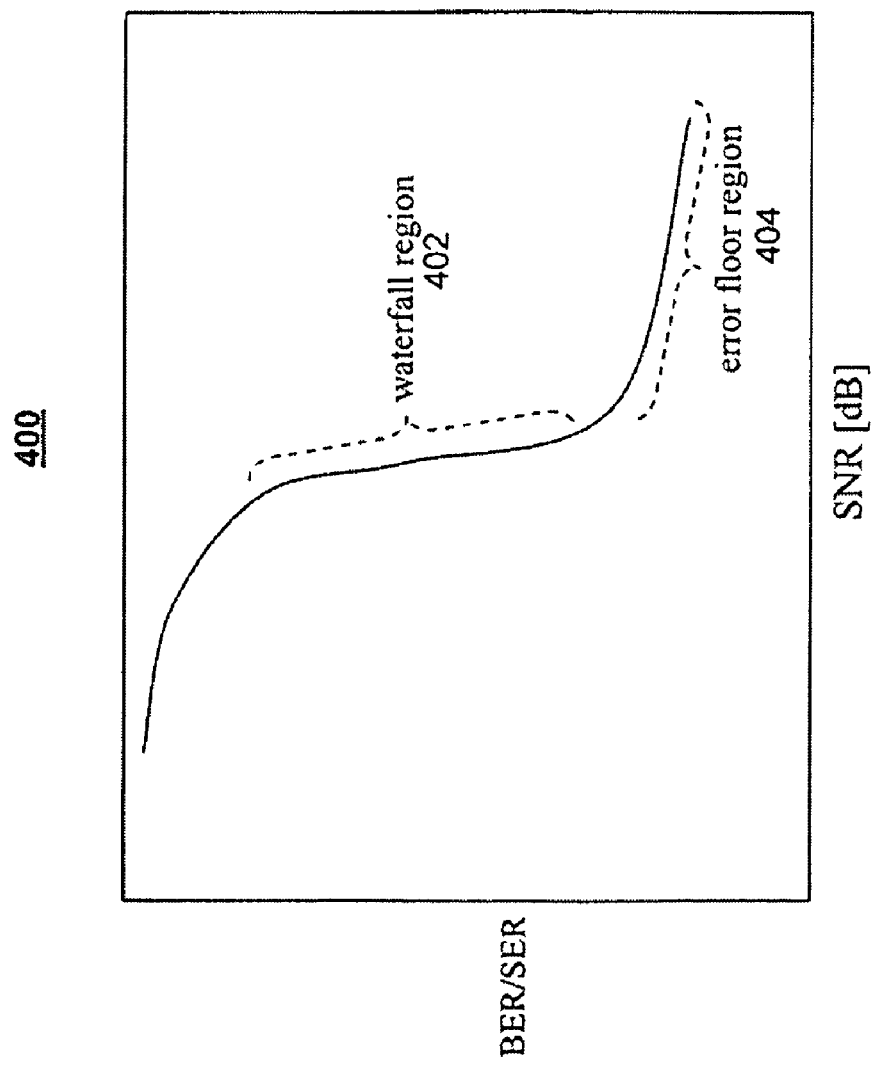
FIG. 4 shows an illustrative graph of regions of error at various signal to noise ratios.

The performance capability of LDPC codes, as described by a mapping of the signal-to-noise ratio (SNR) compared to the bit error rate (BER) or sector error rate (SER), generally includes two regions of operation: the waterfall region and the error floor region. FIG. 4 shows an illustrative graph 400 of an LDPC performance curve with waterfall region 402 and error floor region 404. In error floor region 404, the BER/SER of the LDPC code disadvantageously asymptotes to a lower limit. Because the normal operating conditions for a communication/storage system (such as communication/storage system 100 of FIG. 1) generally correspond to error floor region 404, lowering error floor 404 can improve the performance of the iterative decoder 116.

The asymptotic behavior of the performance curve in error floor region 404 is partially due to the existence of near-codewords (also known as trapping sets) in LDPC codes. A near-codeword of a linear code is a set of erroneous symbols for which there are very few unsatisfied check equations, or check nodes if referring to a Tanner graph representation of an LDPC code (such as Tanner graphs 202 and 204 in FIG. 2). Near-codewords may be code dependent and/or decoder dependent. A set of bits $[b_1, b_2, \ldots b_k]$ is a (K,s)-type near codeword if the following equation is satisfied:

$$\text{Weight}(H^* e_b) = s$$

where H is the parity check matrix of an LDPC code, $e_b$ is an error vector of bits with entries equal to bit "1" in positions $b_1$, $b_2, \ldots b_k$ and all other entries of $e_b$ are 0. Near-codewords that have low values of K and s, for example, for some high-rate LDPC codes, values of K less than 20 and s less than 6, may be referred to as relevant near-codewords.

In an iterative decoder (such as iterative decoder 300 of FIG. 3), if the channel that is supplying received vector 310 is operating at a high SNR the iterative decoder may converge to either a stable error or an oscillating error. A stable error occurs when after multiple channel iterations in iterative decoder 300, the hard decisions (e.g., decoded bits) produced using the soft information provided by iterative decoder 300 does not change even though bit errors remain. An oscillating error occurs when after multiple channel iterations or inner iterations in iterative decoder 300, successive channel iterations or inner iterations produce hard decisions that oscillate between two or more values that contain bit errors.

As iterative decoder 300 performs successive channel iterations, the extrinsic information provided by SISO channel detector output LLRs 304 may improve. Even when iterative decoder 300 is operating at or close to an error floor region level of performance (e.g., iterative decoder 300 is producing errors in the vicinity of the error floor region 404 in FIG. 4), the extrinsic information provided by the SISO channel detector output LLRs 304 may improve. However, after a particular channel iteration, SISO channel detector output LLRs 304 corresponding to particular bits of hard decision may become saturated, meaning that the SISO channel detector LLRs 304 exceed the range of bit precision allocated to represent the LLRs (i.e., the values for the LLRs are clipped). This saturation may contribute to the LDPC decoder 306 to become stuck in an undesirable state, e.g. stuck producing a near-codeword. Once the LDPC decoder 306 is stuck in this fashion, data passed to LDPC decoder 306 by the SISO channel detector 302 may not drive the LDPC decoder 306 out of the undesirable state. Accordingly, it may be desirable to modify the algorithm run by iterative decoder 300 so that LDPC decoder 306 is reinitialized when these states are observed or predicted.

FIGS. 5-8 show flowcharts for various processes for iterative decoding. These processes may be run on an iterative decoder (such as iterative decoder 300 of FIG. 3). The iterative decoder may have a SISO channel detector (such as SISO channel detector 302 in FIG. 3) and an LDPC decoder (such as LDPC decoder 306 in FIG. 3). In each process, two modes of operation may be employed—a regular mode of operation and an error recovery mode of operation. A regular mode of operation may be used when the iterative decoder is producing a number of bit errors or sector errors consistent with the waterfall region of operation (such as waterfall region 402 in FIG. 4). An error recovery mode of operation may be invoked when an iterative decoder in the regular mode of operation is producing a number of bit errors or sector errors consistent with the error floor region of operation (such as error floor region 404 of FIG. 4), and the iterative decoder fails to converge to a valid codeword.

Figure 5:
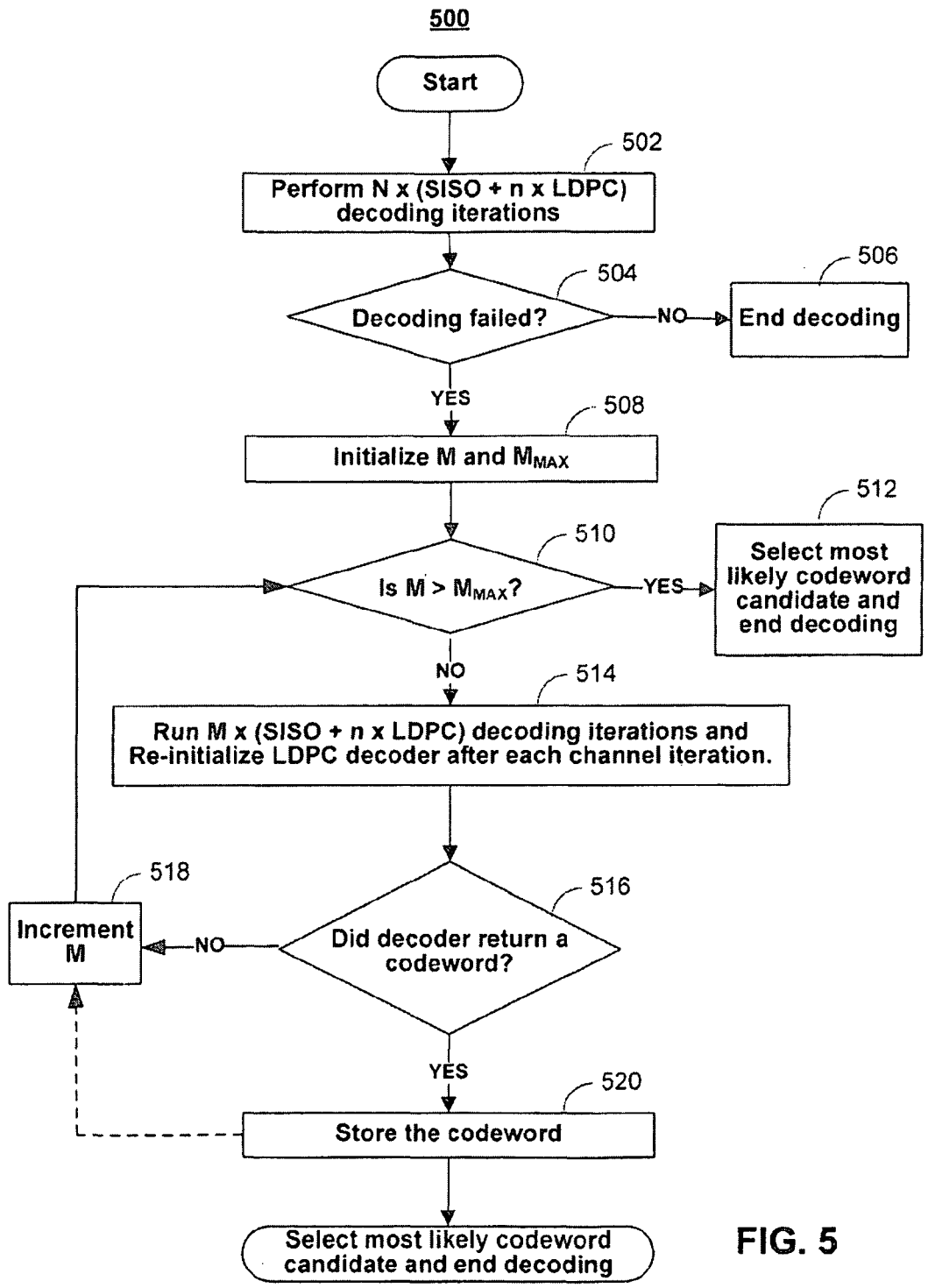
FIG. 5 shows a flowchart of a process for iteratively decoding an LDPC code.

FIG. 5 shows a flowchart of a process 500 for iteratively decoding an LDPC code. The regular mode of operation in process 500 may include running multiple channel iterations in an iterative decoder. Within each outer channel iteration in regular mode, several inner LDPC iterations in the LDPC decoder may be performed. In addition, in regular mode the check-to-bit messages from a previous iteration in the LDPC decoder may be used in a successive iteration. The error recovery mode of operation in process 500 may differ from this operation as described below.

Process 500 may begin at step 502. At step 502, data is received and a number of channel iterations (for example, N iterations) are performed on the received data in a regular mode of operation. Each channel iteration includes running a SISO channel detector and n (where n is 1 or more) inner LDPC iterations in an LDPC decoder. This allows the soft information generated by the LDPC decoder to be refined before the soft information is sent back to the SISO channel detector. In each successive channel iteration in the iterative decoder, the LDPC decoder may use the check-to-bit messages that it produced during a previous channel iteration. This ensures that there is continuity in the decoding between successive channel iterations. The soft information produced at step 502 may be evaluated. This evaluation may include producing a set of decoded data based on the soft information, and then determining whether the decoded data yields a valid codeword in a particular LDPC code. Once the soft information has been evaluated, process 500 executes step 504.

At step 504, process 500 determines whether the decoding performed in step 502 has failed. This determination is based on an evaluation of the soft information produced at step 502, as discussed above. For example, if it is determined at step 502 that a valid codeword has been produced, step 504 may determine that the decoding has not failed. If the decoding has not failed, process 500 ends the decoding at step 506. When process 500 ends decoding at step 506, the data produced by the decoding may be saved for further processing. However, if at step 504 it is determined that the decoding has failed, process 500 executes step 508.

At step 508, a new mode decoding is started and a new schedule for decoding is initialized. This new schedule may be referred to an error recovery mode of operation, as the decoder was unable to converge to a valid codeword during the decoding at step 502. The error may be due to the presence of a near-codeword produced during decoding. During this initialization, at least two variables are set—the current number of channel iterations M and the maximum number of channel iterations $M_{max}$. Successive decoding rounds may then be performed with M channel iterations, M+1 channel iterations, etc., up to $M_{max}$ channel iterations, during execution of steps 510, 514, 516, 518, and 520 as described below. Thus, $M_{max}$ is set to be greater than M. For example, $M_{max}$ may be set to be equal to M+5, M+10, M+20, M+50, or any other suitable number. Once M and $M_{max}$ have been initialized, process 500 executes step 510. At step 510, process 500 evaluates the inequality $M > M_{max}$. If $M > M_{max}$, then process 500 executes step 512. Otherwise, process 500 executes step 514. At step 512, the most likely codeword candidate is selected from a set of stored codewords (if any were found). The set of stored codewords may be produced during execution of steps 510, 514, 516, 518, and 520. The most likely codeword may be selected according to a metric such as distance to the received vector or any other suitable metric.

At step 514, M channel iterations are performed. Similar to the decoding performed at step 502, each channel iteration includes running a SISO channel detector and one or more inner LDPC iteration in an LDPC decoder. However, unlike the decoding performed at step 502, the LDPC decoder is reinitialized after every channel iteration (every update by the SISO channel detector). For example, the check-to-bit messages in the LDPC decoder may be set to zero after every iteration of the SISO channel detector. This reinitialization may prevent the LDPC decoder from becoming stuck in an undesirable state and may allow the LDPC decoder to converge to a valid codeword Thus, the reinitialization may improve performance as compared to the regular mode of operation at high SNRs, e.g., the error-floor region of operation, illustrated by error floor region 404 in FIG. 4. This reinitialization may not improve the bit error rate or sector error rate at SNRs characteristic of the waterfall region of operation, illustrated by waterfall region 402 in FIG. 4. After M channel iterations are performed, process 500 executes step 516.

At step 516, process 500 determines whether the iterative decoder returned a codeword. This determination may be made similar to the process discussed in step 504—e.g., the decoded bits produced by the decoder may be evaluated to determine whether a valid codeword has been produced. If it is determined that the iterative decoder has returned a valid codeword, process 500 executes step 520. Otherwise, process 500 executes step 518. At step 520, the returned codeword may be stored. Process 500 may then either proceed to execute step 518, or end decoding. In an embodiment, process 500 may end decoding after a single codeword is produced. Alternatively, decoding may be ended after a set of codewords are produced and the most likely codeword is selected, as described with respect to step 512. At step 518, the current number of channel iterations, M, is incremented as the decoder prepares for the next round of decoding. For example, M may be incremented by 1, 2, 5, 10, or any other suitable increment in light of the maximum number of channel iterations $M_{max}$. After incrementing M, process 500 may start the next round of decoding by again executing step 510.

Figure 6:
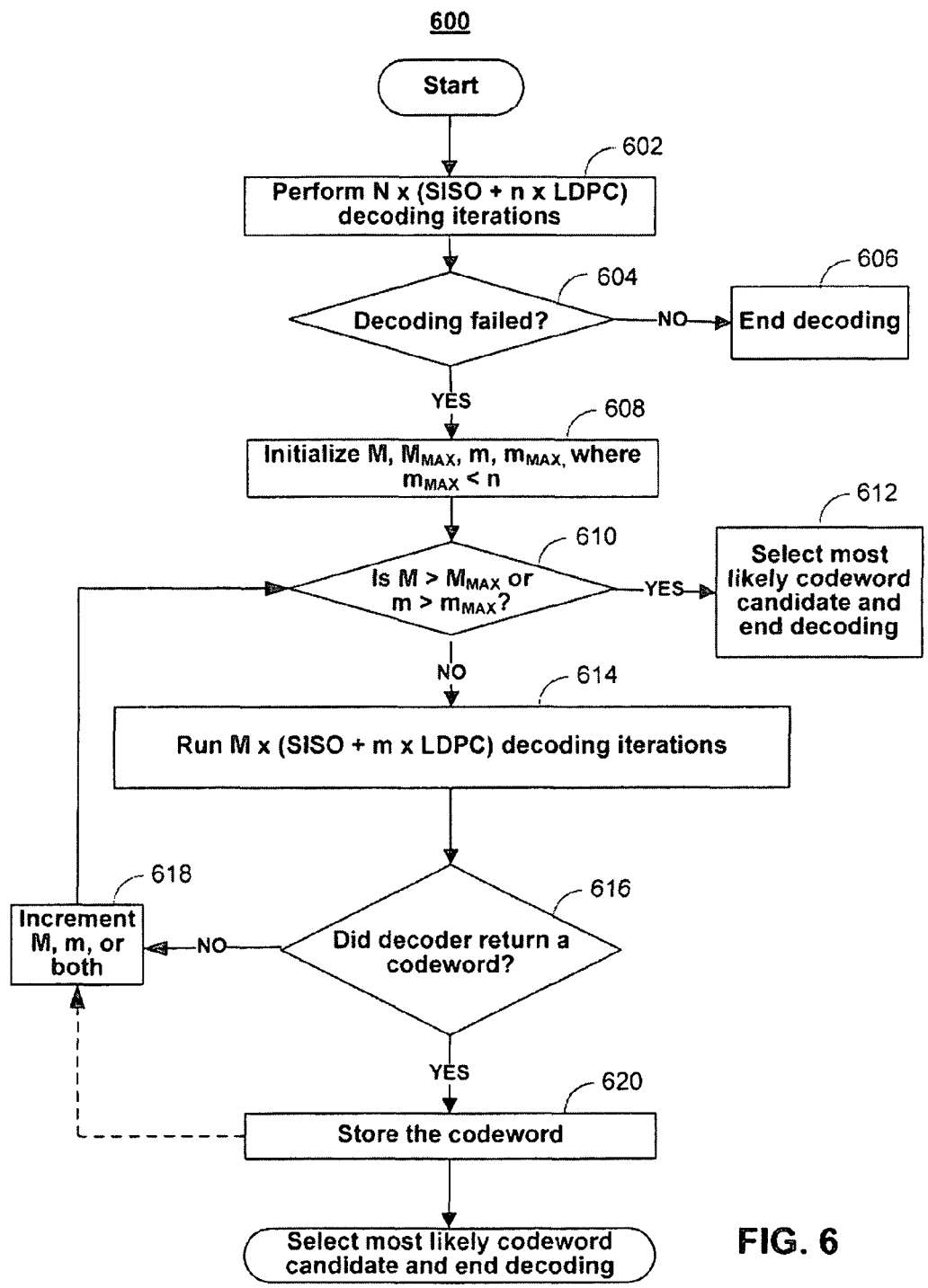
FIG. 6 shows a flowchart of a process for iteratively decoding an LDPC code.

FIG. 6 shows a flowchart of a process 600 for iteratively decoding an LDPC code. The regular mode of operation in process 600 is substantially similar to the regular mode of operation in process 500. Process 600 may begin at step 602. At step 602, data is received and a number of channel iterations (for example, N iterations) are performed on the received data in the regular mode of operation. The channel iterations may be substantially similar to those described with respect to step 502 of process 500. Once the soft information produced by the decoding in step 602 is evaluated, process 600 executes step 604.

At step 604, process 600 determines whether the decoding performed in step 604 has failed. This determination is substantially similar to the determination in step 504 of process 500. If the decoding has not failed, process 600 ends the decoding at step 606. When process 600 ends decoding at step 606, the data produced by the decoding may be saved for further processing. However, if at step 604 it is determined that the decoding has failed, process 600 executes step 608.

At step 608, a new error recovery mode of operation is initialized, as the decoder was unable to produce valid data due to an error during the decoding at step 602. The error may be due to the presence of a near-codeword produced during decoding. During this initialization, at least four variables are set—the current number of channel iterations M, the maximum number of channel iterations $M_{max}$, the current number of inner LDPC iterations m, and the maximum number of inner LDPC iterations $m_{max}$. Successive decoding rounds may then be performed with M channel iterations, M+1 channel iterations, etc., up to $M_{max}$ channel iterations, during execution of steps 610, 614, 616, 618, and 620 as described below. A greater number of inner LDPC decoder iterations may be performed within each successive round of iterative decoding, up to $m_{max}$ inner LDPC decoder iterations. Thus, $M_{max}$ is set to be greater than M or equal to M, and $m_{max}$ is set to be greater than m or equal to m. In an embodiment, $M_{max}$ may be set to be equal to M, and $m_{max}$ may be set to be equal to n−1, where n is the number of inner LDPC iterations performed in regular mode 602. In another embodiment, $m_{max}$ may be set to be equal to n−1, and $M_{max}$ may be set to M+5. Generally, value of m may be set to be low—for example, 1, 2, or 5. Once the variables are set for the new schedule of decoding, process 600 executes step 610.

At step 610, process 600 evaluates the inequalities $M>M_{max}$ and $m>m_{max}$. If $M>M_{max}$ or $m>m_{max}$, then process 600 executes step 612. Otherwise, process 600 executes step 614. At step 612, the most likely codeword candidate is selected from a set of stored codewords. The set of stored codewords may be produced during execution of steps 610, 614, 616, 618, and 820. The most likely codeword may be selected according to a metric such as distance to the received vector or any other suitable metric.

At step 614, M channel iterations are performed. The number of inner LDPC decoder iterations may be equal to the current value of m, where m is typically less than n. Thus, process 600 typically runs a smaller number of inner LDPC iterations in the LDPC decoder before feeding soft information back to the SISO channel detector. Also similar to the decoding performed at step 602, in each successive channel iteration in the iterative decoder, the LDPC decoder may use the check-to-bit messages from a previous channel iteration. Running a smaller number i iterations in the LDPC decoder without reinitializing the LDPC decoder after every iteration of the SISO channel detector may allow for better performance as compared to the error recovery mode of process 500 at particular values of m. For example, when m is 1, process 600 may produce fewer near-codewords and thus fewer bit errors or sector errors in the error floor region of operation (such as the error floor region 404 in FIG. 4). However, this decoding scheme may not be as effective as the one discussed in the error recovery mode of process 500 at low SNRs. After M channel iterations are performed, process 600 executes step 616.

At step 616, process 600 determines whether the iterative decoder returned a codeword. This determination may be similar to the process discussed in step 504 of process 500. If it is determined that the iterative decoder has returned a codeword, process 600 executes step 620. Otherwise, process 600 executes step 618. At step 620, the returned codeword may be stored. Process 600 may then either proceed to execute step 618, or end decoding. In an embodiment, process 600 may end decoding after a single codeword is produced. Alternatively, decoding may end after a set of codewords are produced and the most likely codeword is selected, as described with respect to step 612. At step 618, the current number of channel iterations M may be incremented, the current number of inner LDPC decoder iterations m may be incremented, or both. After incrementing these variables, process 600 may start the next decoding round by executing step 610 again.

Figure 7:
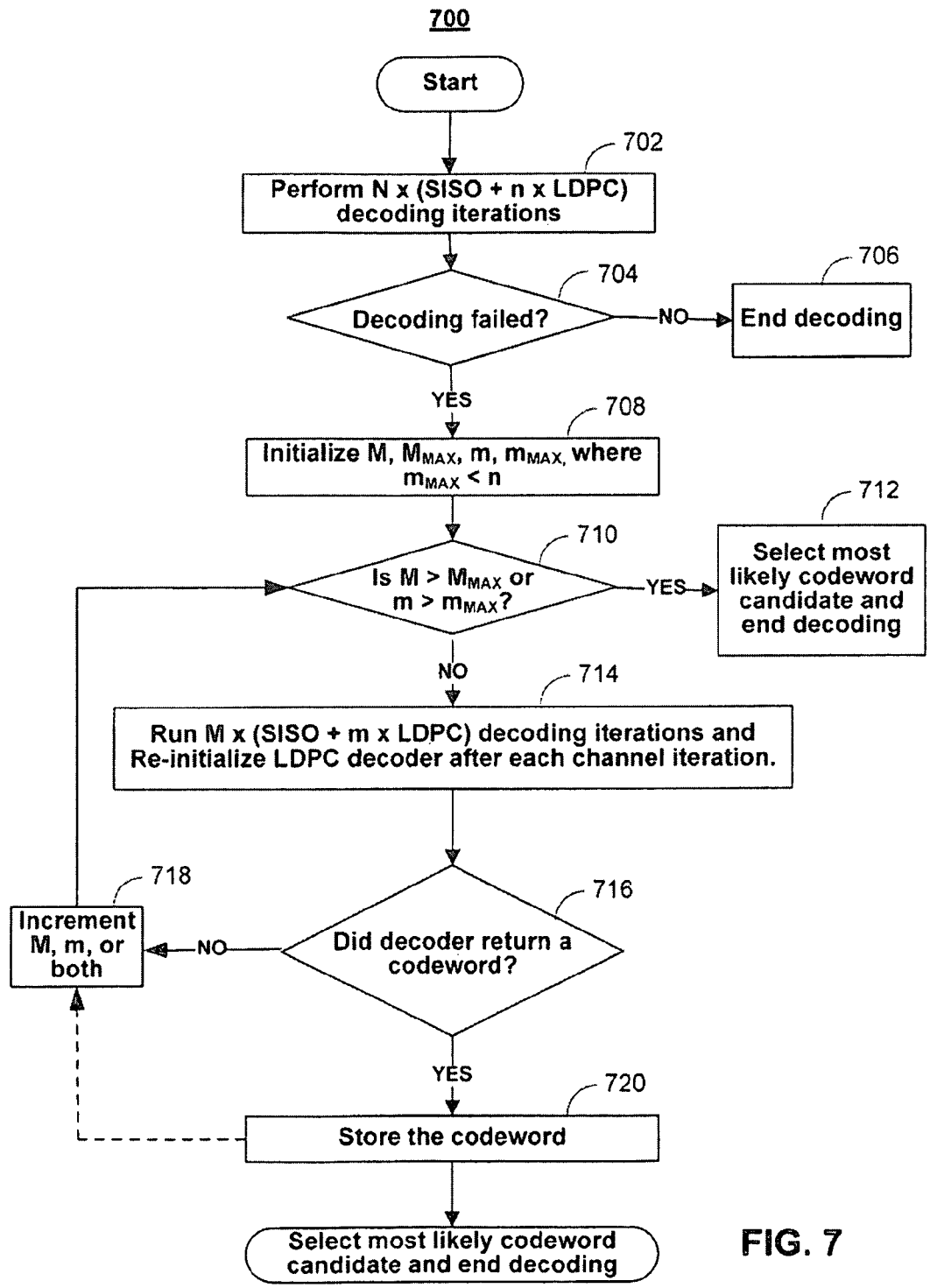
FIG. 7 shows a flowchart of a process for iteratively decoding an LDPC code.

FIG. 7 shows a flowchart of a process 700 for iteratively decoding an LDPC code. The regular mode of operation in process 700 is substantially similar to the regular mode of operation in processes 500 and 600. Process 700 may begin at step 702. At step 702, data is received and a number of channel iterations (for example, N iterations) are performed in the received data in the regular mode of operation. The channel iterations may be substantially similar to those described with respect to step 602 of process 600. Once the soft information produced by the decoding in step 702 is evaluated, process 700 executes step 704.

At step 704, process 700 determines whether the decoding performed in step 704 has failed. This determination is substantially similar to the determination in step 504 of process 500. If the decoding has not failed, process 700 ends decoding at step 706. When process 700 ends decoding at step 706, the data produced by the decoding may be saved for further processing. However, if at step 704 it is determined that the decoding has failed, process 700 executes step 708.

At step 708, a new schedule for decoding is initialized. This new schedule may be initialized substantially similar to step 608 in process 600. Once the variables are set for the new schedule of decoding, process 700 executes step 710. At step 710, inequalities are evaluated in the same manner as step 610 in process 600. If $M > M_{max}$ or $m > m_{max}$, then process 700 executes step 712. Otherwise, process 700 executes step 714. At step 712, the most likely codeword candidate is selected from a set of stored codewords. The set of stored codewords may be produced during execution of steps 710, 714, 716, 718, and 720. The most likely codeword may be selected according to a metric such as distance to the received vector or any other suitable metric.

At step 714, M channel iterations are performed. The number of inner LDPC decoder iterations is equal to the current value of m. Thus, process 700 typically runs a smaller number of iterations in the LDPC decoder before feeding soft information back to the SISO channel detector. However, unlike process 600 and the decoding performed at step 702, the LDPC decoder is reinitialized after every iteration of the SISO channel detector. For example, the check-to-bit messages in the LDPC decoder may be set to zero after every channel iteration of the SISO channel detector. This reinitialization may cause the LDPC decoder to converge to a valid codeword more often, e.g. produce fewer near-codewords. The undesirable near-codeword (trapping set) state may be due to LLRs within the LDPC decoder being clipped and fixed to unfavorable values in code graph cycles that belong to a trapping set. Thus, the reinitialization may allow for better performance as compared to the regular mode of operation at high SNRs, i.e. the error-floor region of operation illustrated by error floor region 404 in FIG. 4. However, this reinitialization may not be as effective in reducing the bit error rate or sector error rate at SNRs characteristic of the waterfall region of operation illustrated by waterfall region 402 in FIG. 4. Thus, process 700 may be better suited for use when the SNR of a communications channel is consistent with that of an error-floor region of operation. After M channel iterations are performed, process 700 executes step 716. Steps 716, 718, and 720 are performed by the iterative decoder substantially the same as steps 616, 618, and 620 in process 600.

The modes of operation used in processes 500, 600, and 700, as well as the parameters used (such as number of channel iterations, number of inner LDPC decoder iterations, etc.), may be application dependent. In other words, these decoding parameters may be dependent on the specifications of the hardware running an iterative decoder. For example, if an iterative decoder has a high number of bits of precision, it may be able to run a higher number of channel iterations without clipping the LLRs, and thus encounters fewer near-codewords than an iterative decoder with a low number of bits of precision. Thus, an iterative decoder with a high number of bits of precision may use an error recovery mode less frequently than an iterative decoder with a low number of bits of precision. Further, the number of times the decoding loops (controlled, for example, by variables M and m) are run in processes 500, 600, and 700 may depend on the particular channel supplying the data. Finally, if there are severe channel errors and/or bursts of channel errors, different decoding schemes may be used other than those in processes 500, 600, and 700, as described below. Severe channel errors or bursts of channel errors may include known (e.g., detected) defects in a data storage channel, or residual (e.g., undetected) defects in a data storage channel. Residual defects typically may result in short bursts of errors which adversely affect the LLRs produced by channel SISO detector.

Figure 8:
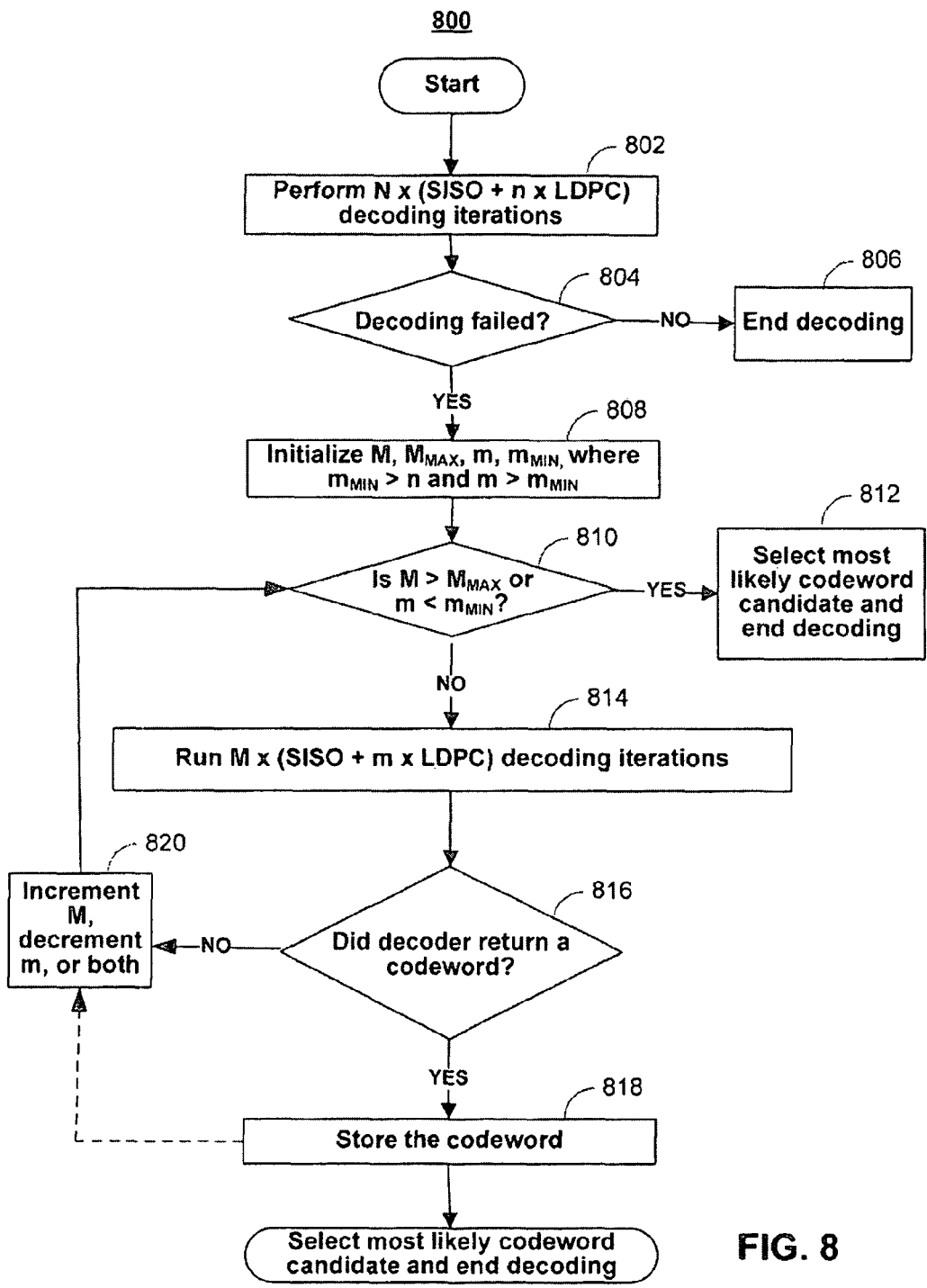
FIG. 8 shows a flowchart of a process for iteratively decoding an LDPC code.

FIG. 8 shows a flowchart of a process 800 for iteratively decoding an LDPC code. Process 800 may begin at step 802. At step 802, data is received and a number of channel iterations (for example, N iterations) are performed on the received data. Within each channel iteration, a number of inner LDPC decoder iterations (for example, n iterations) may be performed. The number of channel iterations, the number of inner LDPC decoder iterations, and whether the LDPC decoder is reinitialized after every channel iteration may be consistent with any of the decoding modes described with respect to processes 500, 600, or 700. The soft information produced at step 802 may be evaluated. This evaluation may include producing a set of decoded data based on the soft information, and then determining whether the decoded data yields a valid codeword in a particular LDPC code. Once the soft information has been evaluated, process 800 executes step 804.

At step 804, process 800 determines whether the decoding preformed in step 802 has failed. This determination is substantially similar to the determination in step 504 of process 500. If the decoding has not failed, process 800 ends decoding at step 806. When process 800 ends decoding at step 806, the data produced by the decoding may be saved for further processing. However, if at step 804 it is determined that the decoding has failed, process 800 executes step 808.

At step 808, a new error-recovery mode of operation is initialized, as the decoder was unable to produce valid data due to an error during the decoding at step 802. The error may be due to the presence of a near-codeword produced during decoding. During this initialization, at least four variables are set—the current number of channel iterations M, the maximum number of channel iterations $M_{max}$, the current number of inner LDPC iterations m, and the minimum number of LDPC iterations $m_{min}$. The minimum number of LDPC iterations $m_{min}$ may be set to be greater than n, which is the number of inner LDPC decoder iterations performed within each channel iteration at step 802, and the current number of LDPC iterations m may be set to be greater than the minimum number of LDPC decoder iterations $m_{min}$. Accordingly, a greater number of inner LDPC iterations may be performed after every iteration of the SISO channel detector in error recovery mode. For example, there may be m=8 inner iterations in the LDPC decoder performed after every iteration of the SISO channel decoder in error recovery mode, as opposed to n=3 inner LDPC iterations in the LDPC decoder performed after every iteration of the SISO channel decoder in regular mode. Running more iterations in the LDPC decoder before returning the soft information to the SISO channel detector may be particularly effective against short severe channel defect errors, because the SISO channel detector produces inaccurate soft information when faced with data that contains consecutive defect errors (defect bursts). Further, $M_{max}$ may be set to be greater than M.

At step 810, process 800 evaluates the inequalities $M > M_{max}$ and $m < m_{min}$. If $M > M_{max}$ or $m < m_{min}$, then process 800 executes step 812. At step 812, the most likely codeword candidate is selected from a set of stored codewords. The set of stored codewords may be produced during execution of steps 810, 814, 816, 818, and 820. The most likely codeword may be selected according to a metric such as distance to the received vector or any other suitable metric.

At step 814, M channel iterations are performed. Within each of the M channel iterations, m inner LDPC decoder iterations are performed. In each successive channel iteration in the iterative decoder, the LDPC decoder may use the check-to-bit messages from a previous channel iteration. Because the soft LDPC information from previous channel iterations is at least partially reused in a current channel iteration, inaccurate information provided by the SISO channel detector may be overpowered by the decoding performed by the LDPC decoder, thus resulting in fewer near-codewords. As discussed above, a much larger number of inner LDPC decoder iterations may be performed in each channel iteration at step 814 than in the iterative decoding performed in step 802. This larger number of LDPC decoder iterations combined with the partial reuse of soft information from the LDPC decoding in previous channel iterations may result in fewer bit errors or sector errors in the error floor region of operation (such as the error floor region 404 in FIG. 4). After M channel iterations are performed, process 800 executes step 816.

At step 816, process 800 determines whether the iterative decoder returned a codeword. This determination may be similar to the process discussed in step 503 of process 500. If it is determined that the iterative decoder has returned a codeword, process 800 executes step 820. Otherwise, process 800 executes step 818. At step 820, the returned codeword may be stored. Process 800 may then either proceed to execute step 818, or end decoding. In an embodiment, process 800 may end decoding after a single codeword is produced. Alternatively, decoding may end after a set of codewords are produced and the most likely codeword is selected, as described with respect to step 812. At step 818, the current number of channel iterations M may be incremented, the current number of inner LDPC decoder iterations m may be decremented, or both. After changing these variables, process 800 may start the next round of decoding by executing step 810 again.

The foregoing describe systems and methods for improving iterative decoding. Those skilled in the art will appreciate that the invention can be practiced by other than the described embodiments, which are presented for the purpose of illustration rather than of limitation.

What is claimed is:

1. A method of decoding received data using an iterative decoder, wherein the iterative decoder comprises a soft-input soft-output (SISO) channel detector and an error correcting code (ECC) decoder, the method comprising:
   in a first decoding mode, performing a plurality of channel iterations on the received data using the iterative decoder, wherein each channel iteration includes an iteration of the SISO channel detector and a predetermined number of iterations of the ECC decoder; and
   in a second decoding mode:
      performing a plurality of decoding rounds on the received data using the iterative decoder, wherein a first of the plurality of decoding rounds include less than the predetermined number of iterations of the ECC decoder, and
      wherein each subsequent decoding round includes at least one of an increased number of channel iterations in the iterative decoder than the previous round and an increased number of iterations of the ECC decoder.

2. The method of claim 1, wherein the second decoding mode further comprises reinitializing the ECC decoder after each channel iteration.

3. The method of claim 2, wherein the ECC decoder is configured to decode data using a message passing algorithm comprising sending extrinsic information from a plurality of check nodes to a plurality of bit nodes, and wherein reinitializing the ECC decoder further comprises setting the extrinsic information sent from the plurality of check nodes to the plurality of bit nodes to zero.

4. A method of decoding received data using an iterative decoder, wherein the iterative decoder comprises a soft-input soft-output (SISO) channel detector and an error correcting code (ECC) decoder, the method comprising:
   in a first decoding mode, performing a plurality of channel iterations on the received data using the iterative decoder, wherein each channel iteration includes an iteration of the SISO channel detector and a predetermined number of iterations of the ECC decoder; and
   in a second decoding mode:
      performing a plurality of decoding rounds on the received data using the iterative decoder, wherein a first of the plurality of decoding rounds include more than the predetermined number of iterations of the ECC decoder, and
      wherein each subsequent decoding round includes at least one of an increased number of channel iterations in the iterative decoder than the previous round and a decreased number of iterations of the ECC decoder.

5. An iterative decoder for decoding received data comprising a soft-input soft-output (SISO) channel detector and an error correcting code (ECC) decoder, the iterative decoder is configured to:
   in a first decoding mode, perform a predetermined number of channel iterations on the received data, wherein each channel iteration includes an iteration of the SISO channel detector and at least one iteration of the ECC decoder;
   in a second decoding mode:
      perform a plurality of decoding rounds on the received data using the iterative decoder, wherein a first of the plurality of decoding rounds include less than the predetermined number of iterations of the ECC decoder, and
      wherein each subsequent decoding round includes at least one of an increased number of channel iterations in the iterative decoder than the previous round and an increased number of iterations of the ECC decoder.

6. The iterative decoder of claim 5, further configured to reinitialize the ECC decoder after each channel iteration in the second decoding mode.

7. The iterative decoder of claim 5, wherein the ECC decoder is configured to decode data using a message passing algorithm comprising sending extrinsic information from a plurality of check nodes to a plurality of bit nodes, and wherein reinitializing the ECC decoder further comprises setting the extrinsic information sent from the plurality of check nodes to the plurality of bit nodes to zero.

8. An iterative decoder for decoding received data comprising a soft-input soft-output (SISO) channel detector and an error correcting code (ECC) decoder, the iterative decoder is configured to:
   in a first decoding mode, perform a predetermined number of channel iterations on the received data, wherein each channel iteration includes an iteration of the SISO channel detector and at least one iteration of the ECC decoder;
   in a second decoding mode:
      perform a plurality of decoding rounds on the received data using the iterative decoder, wherein a first of the plurality of decoding rounds include more than the predetermined number of iterations of the ECC decoder, and
      wherein each subsequent decoding round includes at least one of an increased number of channel iterations in the iterative decoder than the previous round and a decreased number of iterations of the ECC decoder.

* * * * *